United States Patent [19]

Nitayama et al.

[11] Patent Number: 5,358,808
[45] Date of Patent: Oct. 25, 1994

[54] EXPOSURE MASK, METHOD OF MANUFACTURING THE SAME, AND EXPOSURE METHOD USING THE SAME

[75] Inventors: Akihiro Nitayama, Kawasaki; Makoto Nakase, Tokyo; Kouji Hishimoto, Yokohama; Hirotsugu Wada, Tokyo, all of Japan

[73] Assignee: Kabushiki Kaisha Toshiba, Kawasaki, Japan

[21] Appl. No.: 94,442

[22] Filed: Jul. 21, 1993

Related U.S. Application Data

[62] Division of Ser. No. 467,149, Jan. 18, 1990, Pat. No. 5,234,780.

[30] Foreign Application Priority Data

Feb. 13, 1989 [JP] Japan .................................. 1-31084
Jul. 13, 1989 [JP] Japan ................................. 1-180920

[51] Int. Cl.$^5$ ............................................. G03F 9/00
[52] U.S. Cl. ................................. 430/5; 430/22; 430/290; 430/311; 430/313; 430/321; 430/396; 430/269; 378/35
[58] Field of Search ............ 430/5, 22, 290, 311, 430/313, 321, 396, 269; 378/35

[56] References Cited

U.S. PATENT DOCUMENTS

| | | | |
|---|---|---|---|
| 4,764,441 | 8/1988 | Ohta et al. | 430/5 |
| 5,045,417 | 9/1991 | Okamoto | 430/5 |
| 5,234,780 | 10/1993 | Nitayama et al. | 430/5 |

FOREIGN PATENT DOCUMENTS 0090924 10/1983 European Pat. Off. ................ 430/5

OTHER PUBLICATIONS

Levenson et al, "Improving Resolution in Photolithography with A Phase-Shifting Mask", IEEE Transactions on Electron Devices, vol. ED-29, No. 12, Dec. 1982.

Levenson et al, "The Phase-Shifting Mask II", IEEE Transactions on Electron Devices, vol. ED-31, No. 6, Jun. 1984.

*Primary Examiner*—Thomas R. Neville
*Attorney, Agent, or Firm*—Oblon, Spivak, McClelland, Maier & Neustadt

[57] ABSTRACT

An exposure mask for lithography, a method of manufacturing the same, and an exposure method using the same are disclosed. A light-transmitting opening of the exposure mask has a main light-transmitting region located in the middle of the opening and having a first optical path length, and phase shift regions adjacent to a light-shielding layer and having a second optical path length, different from the first optical path length. Light transmitted through each phase shift region interferes with light transmitted through the main light-transmitting region at the edges of the light-transmitting opening, thus enabling a sharp photo-intensity distribution of total transmitted light to be obtained. As a result, the resolution of the exposure mask is improved.

13 Claims, 13 Drawing Sheets

LINE/SPACE PORTION   ISOLATED SPACE PORTION

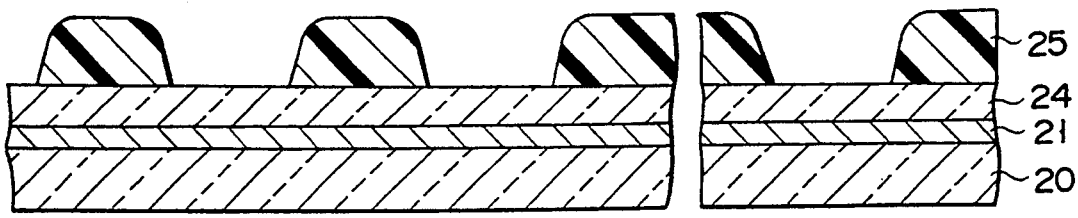
F I G. 4A
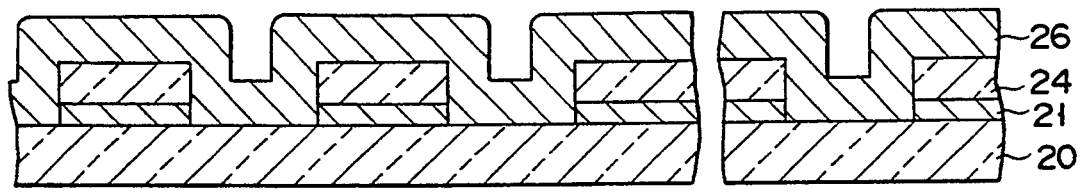
F I G. 4B
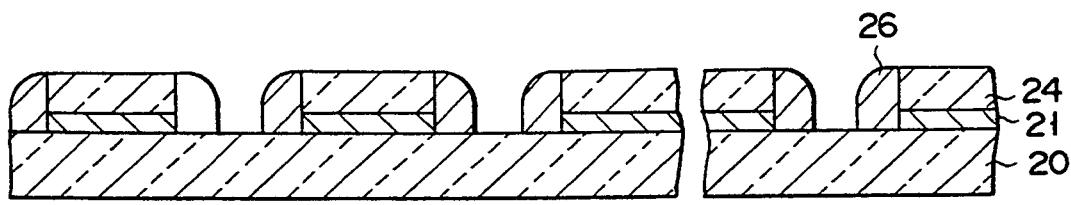
F I G. 4C
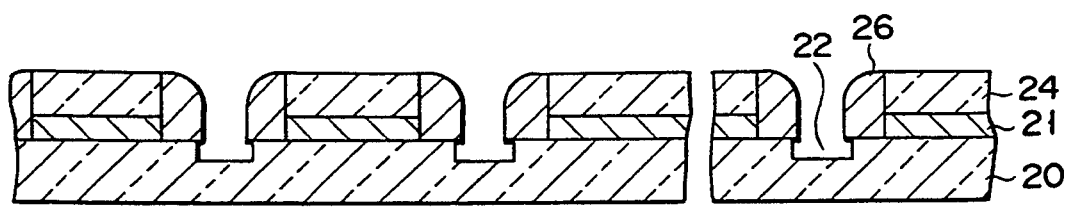
F I G. 4D
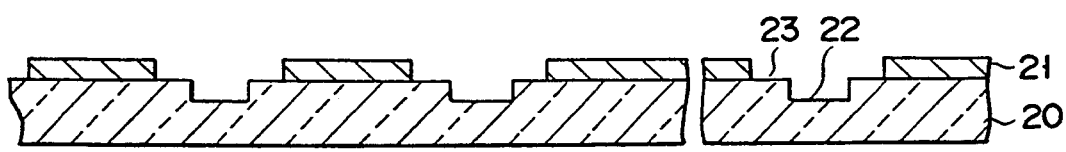
F I G. 4E

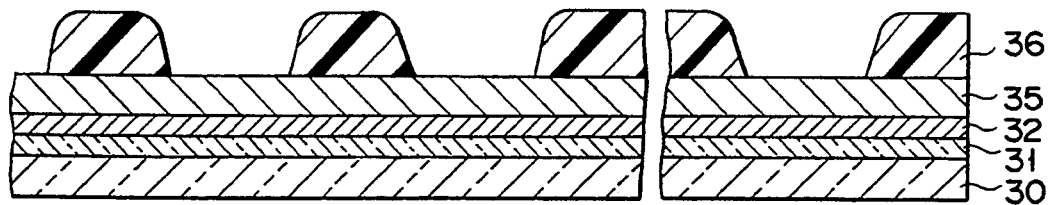
F I G. 6A
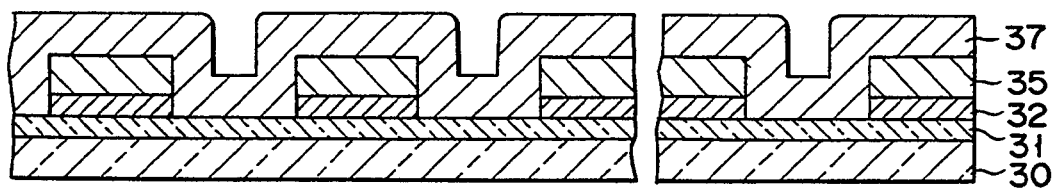
F I G. 6B
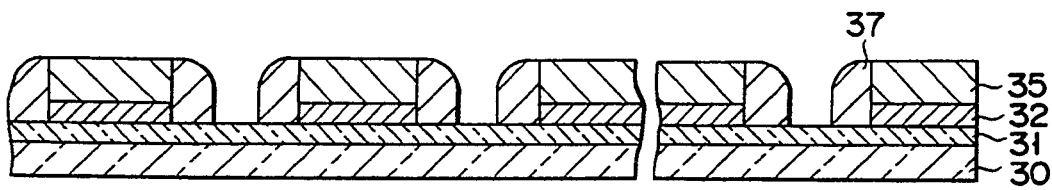
F I G. 6C
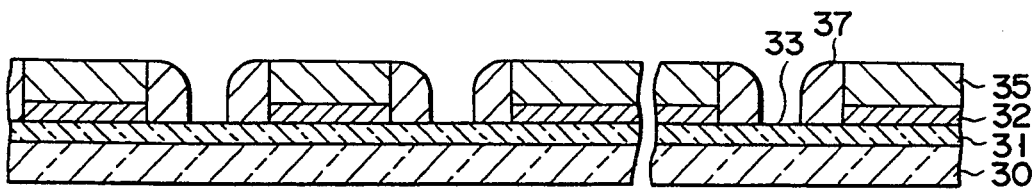
F I G. 6D
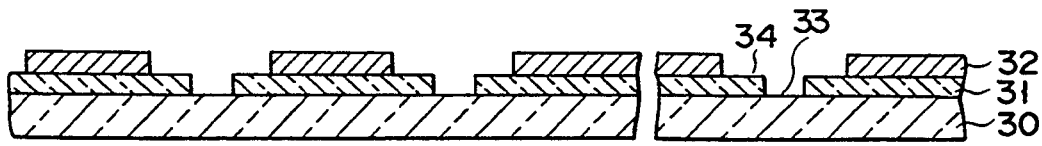
F I G. 6E

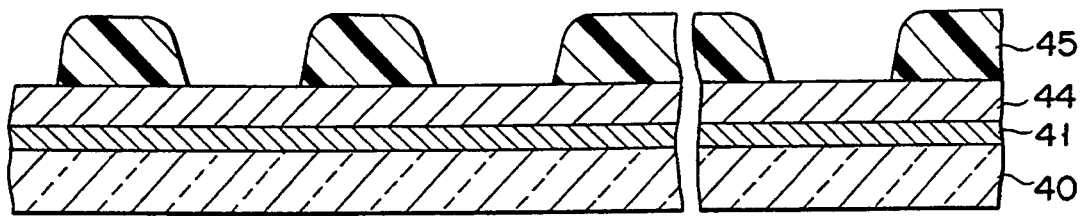
F I G. 7A
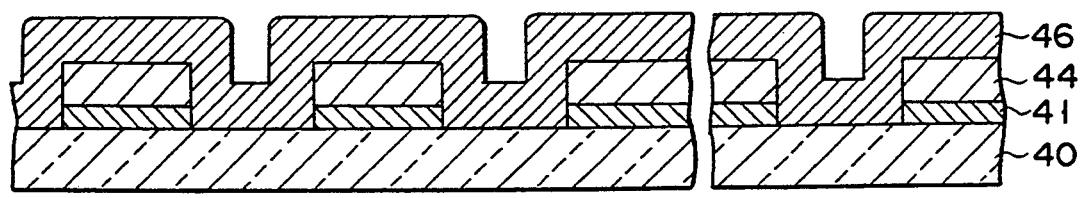
F I G. 7B
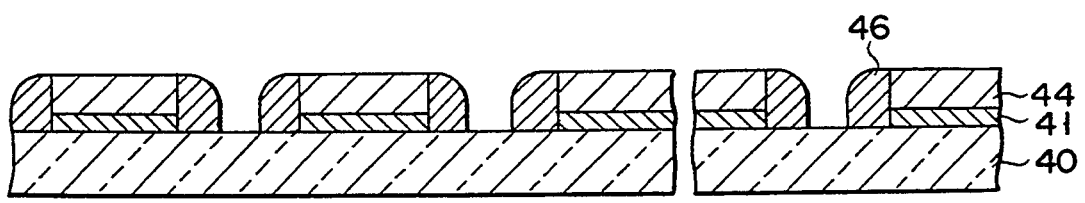
F I G. 7C
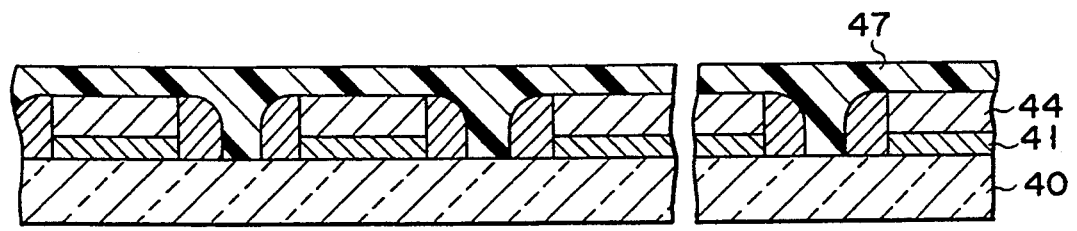
F I G. 7D
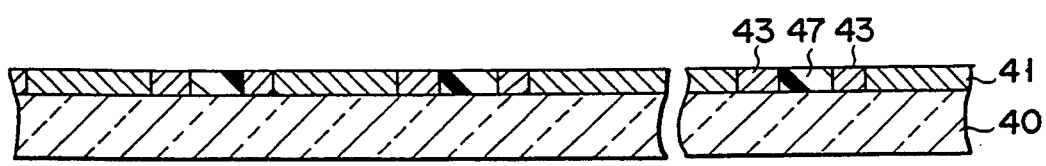
F I G. 7E
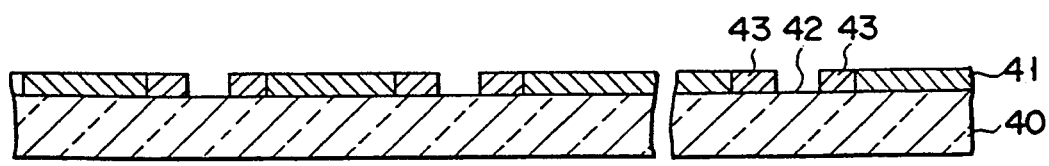
F I G. 7F

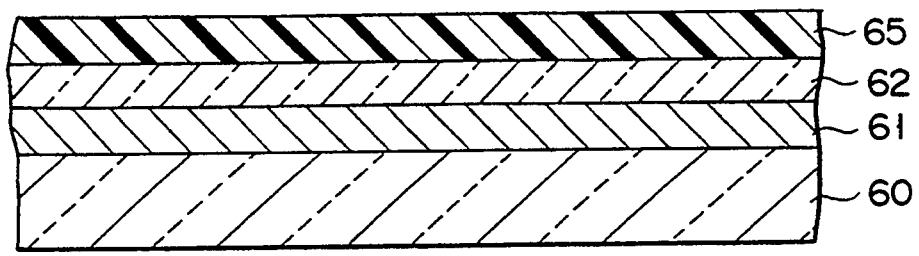
F I G. 9A
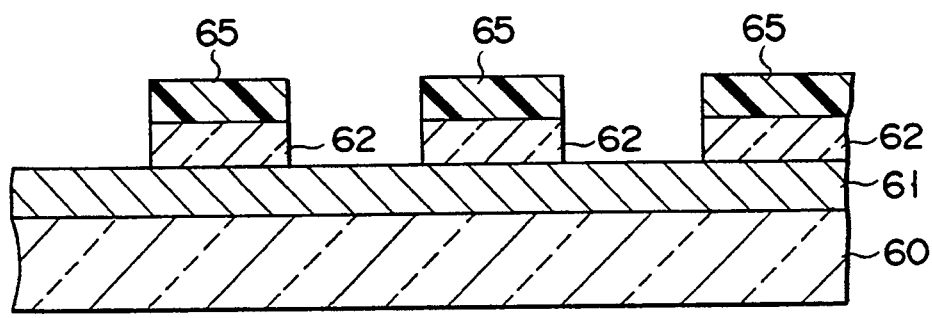
F I G. 9B
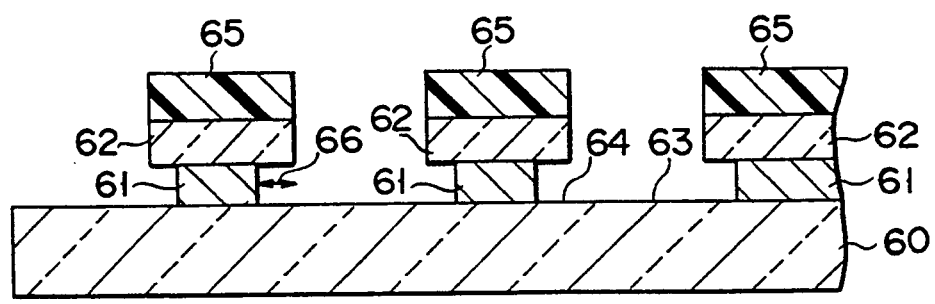
F I G. 9C
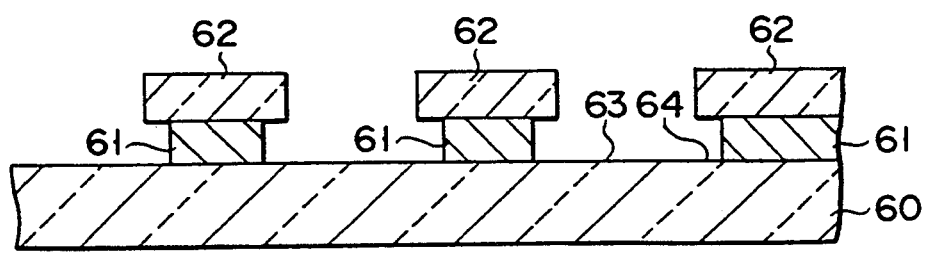
F I G. 9D

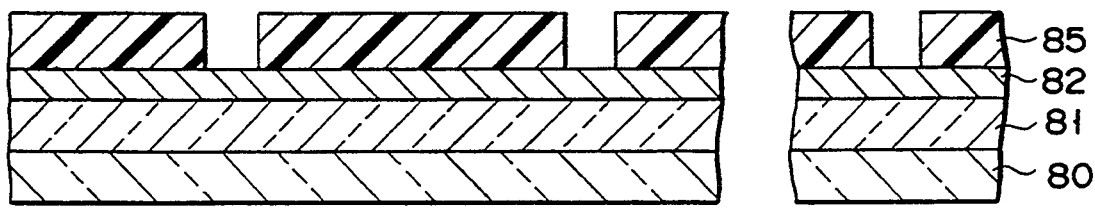
F I G. 11A
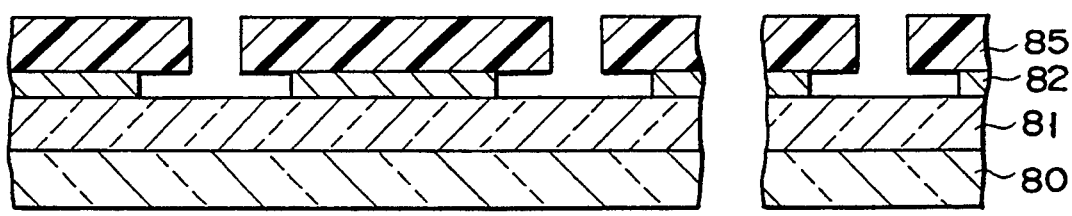
F I G. 11B
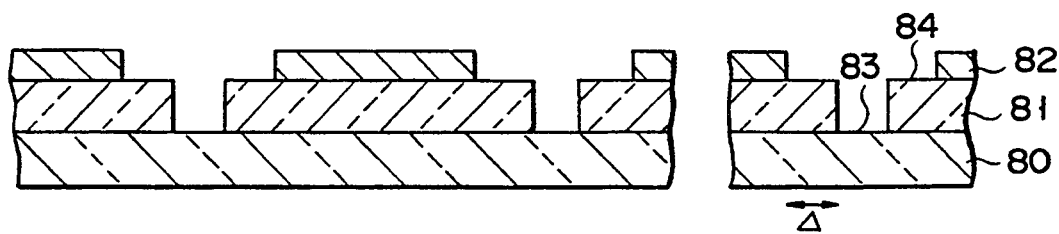
F I G. 11C

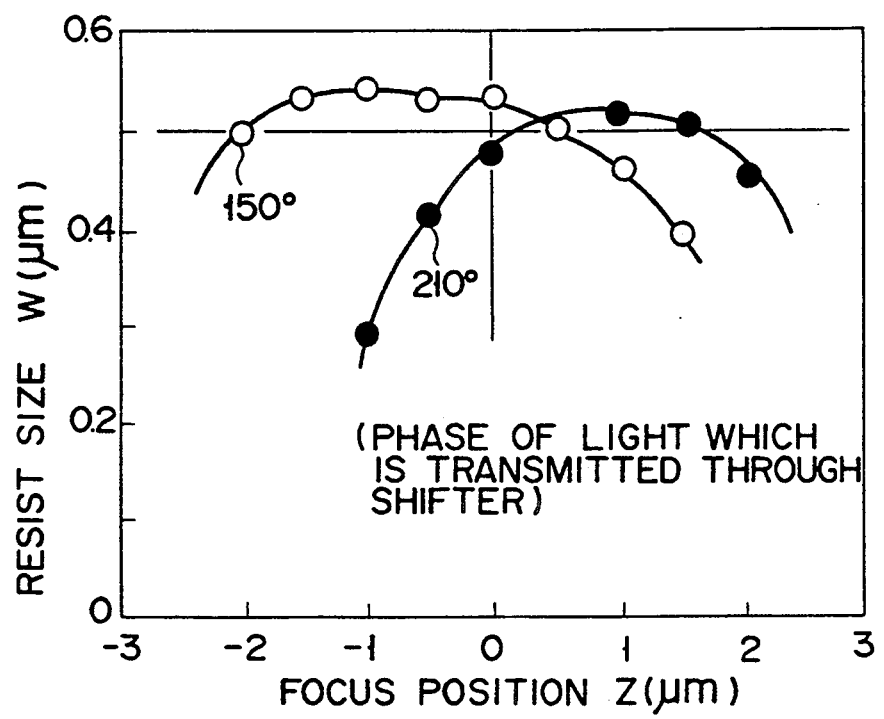
F I G. 14

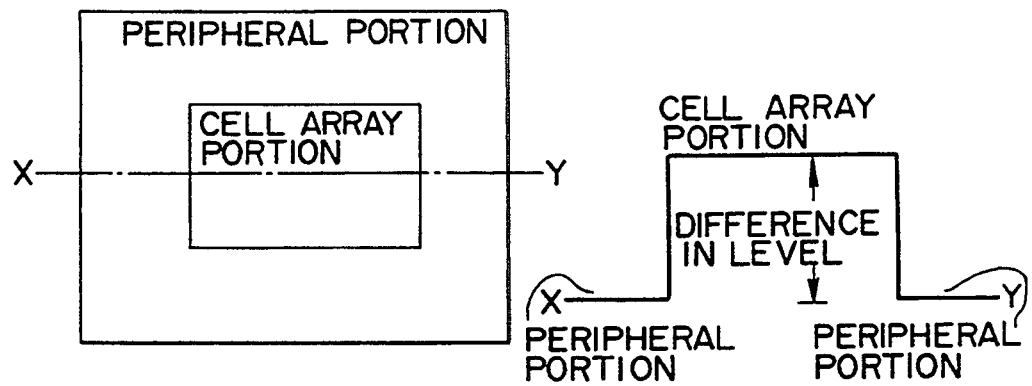
F I G. 15A     F I G. 15B
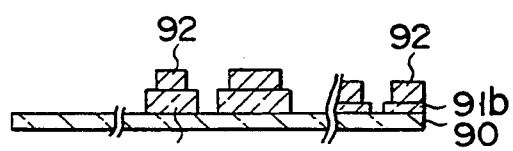
F I G. 15C
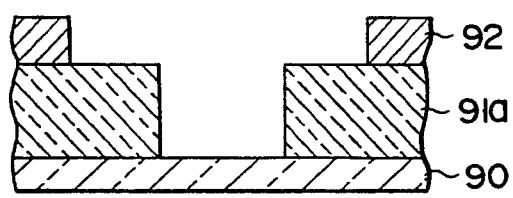     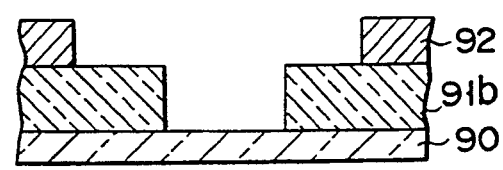
F I G. 16A     F I G. 16B

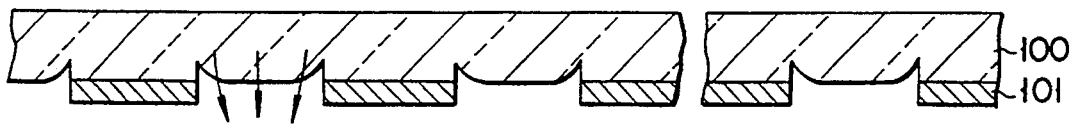
F I G. 17A
F I G. 17B
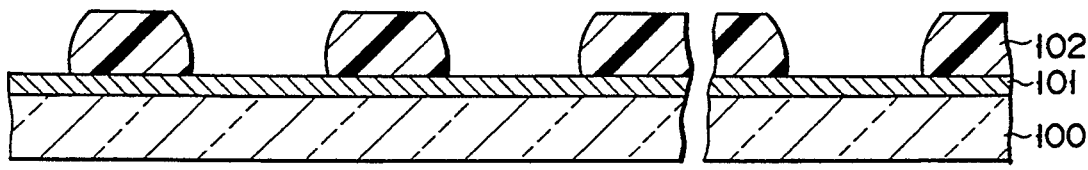
F I G. 18A
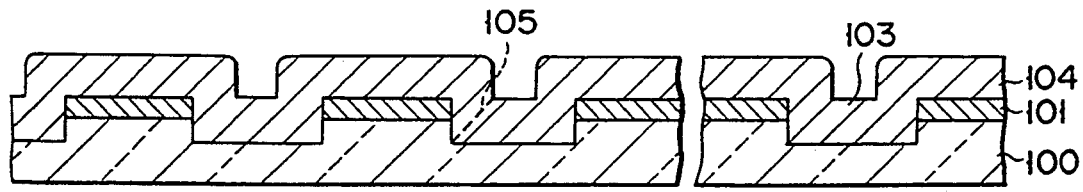
F I G. 18B
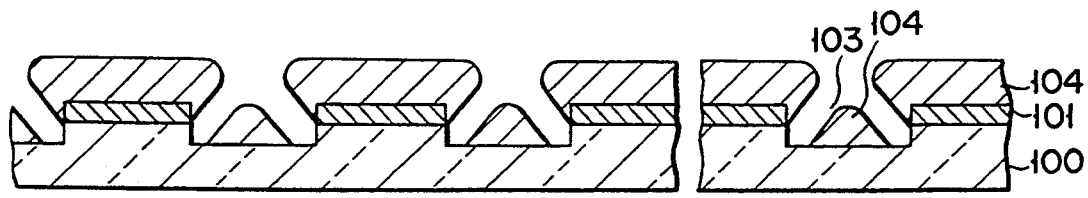
F I G. 18C
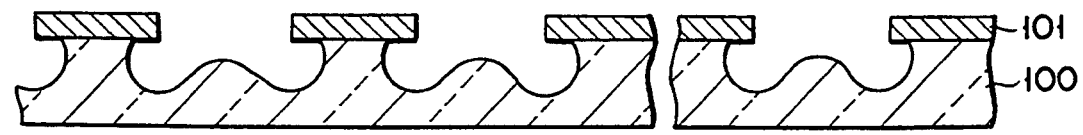
F I G. 18D

EXPOSURE MASK, METHOD OF MANUFACTURING THE SAME, AND EXPOSURE METHOD USING THE SAME

This is a division of application Ser. No. 07/467,149, filed on Jan. 18, 1990 now U.S. Pat. No. 5,234,780.

BACKGROUND OF THE INVENTION

1. Field of the Invention

The present invention relates to an exposure mask, a method of manufacturing the same, and an exposure method using the same and, more particularly, to an exposure mask used for lithography.

2. Description of the Related Art

In the past few years, the packing density and the degree of micropatterning of semiconductor ICs have steadily increased. In the manufacture of semiconductor ICs, lithography is an especially important process, and consequently, various lithography techniques, using G-line rays, i-line rays, an excimer laser, x-rays, and the like as light sources have been evaluated. Similar study has been carried out with regard to resists, so as to develop new resists and new resist treatments, such as the REL method. It has been carried out with regard to Si wafers as well, so as to develop new wafer treatments, such as the three-layer resist method, the CEL method, the image reverse method, and the like.

In contrast to this, techniques of manufacturing masks have received less study. However, recently, a phase shift method for improving the resolution of mask patterns has been proposed and has received a great deal of attention (IBM 1986, IEEE Trans. Elect. Devices. Vol. ED-29, 1982, CP 1828; 1988, Fall Applied Physics Meeting 4a-K-7, 8 (p497)). FIGS. 1A to 1C show a mask manufacturing process for photolithography using this phase shift method.

In this process, as shown in FIG. 1A, a light-shielding layer 11 consisting of Cr (chromium) or $Cr_2O_3$ (chromium oxide) is deposited on a quartz mask substrate 10 to a thickness of about 100 run by sputtering. A resist 12 is then patterned.

As shown in FIG. 1B, the light-shielding layer 11 is etched by wet etching or reactive ion etching, using the patterned resist 12 as a mask.

Subsequently, as shown in FIG. 1C, shifters 13 for shifting the phase of incident light are formed by using, for example, a resist. In this case, alternate openings in a line/space portion are covered with the phase shifters 13. In an isolated space portion, auxiliary patterns 14, which cannot be individually resolved, are formed on both the sides of an opening, and are covered with the phase shifters 13.

Since, when exposure is performed by using such a mask, the phases of light beams passing through the respective openings are alternately inverted, as indicated by dotted lines in FIG. 2B, the photo-intensity on a portion immediately under each light-shielding layer 11 is greatly decreased. As a result, the photo-intensity distribution indicated by a solid curve in FIG. 2B is realized. With this mask, IC patterns can be formed having a dimensional resolution of about ½ that of IC patterns formed with a conventional mask.

However, the following problems have arisen in connection with the process of manufacturing the phase shift type photolithography mask described above.

Firstly, after the mask pattern is formed, the shifters 13 are arranged on the alternate openings formed in the line/space portion, while the auxiliary patterns 14 are formed in the light-shielding layers 11 in the isolated space portion, the shifters 13 then having to be arranged on the patterns 14. Therefore, at least two pattern formation steps and an alignment step are required for forming the mask pattern and the phase shifters. However, since a mask drawing electron-beam exposure unit generally does not process an alignment function, an exposure unit capable of alignment, such as a direct drawing EB exposure unit, must be specially developed. This entails considerable labor, time, and cost.

Secondly, a large amount of complicated data processing is required for the EB data of the mask pattern and the shifter lithography data.

Thirdly, the auxiliary patterns 14 must be formed having a pattern size smaller than the minimum pattern size of a mask.

Fourthly, light passing through the auxiliary patterns 14 may not be sufficiently cancelled, and hence a pattern may be distorted.

Lastly, patterns each having the same resolution cannot be formed in an isolated line portion, an island portion, and the like, such as other patterns can be.

As described above, various problems arise in connection with the process of manufacturing conventional phase shift type masks for photolithography; for example, a new EB mask exposure unit must be specially developed, a large amount of complicated data processing is required in relation to the EB data of a pattern and the shifter process data, auxiliary patterns must be formed having a pattern size smaller than the minimum pattern size of a mask, a pattern formed in an isolated space portion may be distorted, and it is difficult to set the same resolution for all the patterns to be formed.

SUMMARY OF THE INVENTION

It is therefore an object of the present invention to provide an exposure mask, a method of manufacturing the same, and an exposure method using the same, which reduces the dependency of an exposure state on the type and size of an exposure mask pattern, and can perform faithful pattern transfer with a constant light amount.

The above object is achieved by the invention defined in the appended claims.

According to the present invention, there is provided an exposure mask for lithography, comprising an optically transparent substrate and a light-shielding layer thereon, the light-shielding layer being patterned to form a single or a plurality of light-transmitting openings, and each of the light-transmitting openings having means for obtaining a sharp photo-intensity distribution of transmitted light.

According to an aspect of the exposure mask of the present invention, the light-transmitting opening comprises a main light-transmitting region located in the middle thereof and having a first optical path length, and a phase shift region adjacent to the light-shielding layer and having a second optical path length, different from the first optical path length. In the above aspect, the phase shift region can be formed by etching down the substrate in the main light-transmitting region. Furthermore, in the above aspect, the phase shift region can be formed by arranging an additional light-transmitting layer in the light-transmitting opening. In order to shift the phase of the light transmitted through the phase shift region by about 180° relative to the phase of the light transmitted through the main light-transmitting region, the difference between the first and second optical path lengths is set to be $\lambda/\{2(n-1)\}$, where $\lambda$ is the wavelength of the transmitted light, and n is the refractive index of the substrate or the additional light-transmitting layer.

When the phase shift region is formed by arranging an additional light-transmitting layer in a light-transmitting opening, the additional light-transmitting layer is arranged between the substrate and the light-shielding layer, with a portion of the light-transmitting layer protruding into the light-transmitting opening; alternatively, the additional light-transmitting layer is arranged on the light-shielding layer with a portion of the light-transmitting layer protruding into the light-transmitting opening, or is arranged on substantially the same plane as that of the light-shielding layer so as to be situated only in the light-transmitting opening.

According to the first aspect of the present invention, there is provided a method of manufacturing an exposure mask for lithography, which mask includes an optically transparent substrate and a light-shielding layer on the optically transparent substrate, the light-shielding layer being patterned to form a single or a plurality of predetermined light-transmitting openings, the light-transmitting opening being constituted by a main light-transmitting region located in the middle thereof, and a phase shift region adjacent to the light-shielding layer, the phase of light which is transmitted through the phase shift region being shifted from that of light which is transmitted through the main light-transmitting region, the method comprising the steps of: forming a light-shielding layer on an optically transparent material layer; forming a first film on the light-shielding layer; forming a resist layer on the first film; patterning the resist layer in correspondence with a light-transmitting opening; etching the light-shielding layer and the first film to a surface of the optically transparent material layer, using the patterned resist layer as a mask; removing the resist layer and covering the optically transparent material layer, the light-shielding layer, and the first film with a second film; anisotropically etching the second film so as to leave the second film only on the side walls of the light-shielding layer and the first film; and forming a phase shift region by using the remnants of the second film.

When, according to the first aspect, the phase shift region is formed by etching down the substrate in the main light-transmitting region, the optically transparent material layer may consist of the optically transparent substrate, and the step of forming the phase shift region by using the remnants of the second film may comprise the steps of etching the optically transparent substrate by a predetermined amount, using the remnants of the first and second films as masks, and then removing the first and second film remnants.

When the phase shift region is formed by the provision of an additional light-transmitting layer between the substrate and the light-shielding layer, with a portion of the additional layer protruding into the light-transmitting opening, the optically transparent material layer may consist of the additional light-transmitting layer arranged on the optically transparent substrate and having a predetermined thickness, and the step of forming the phase shift region by using the remnants of the second film may comprise the steps of etching the additional light-transmitting layer to a surface of the optically transparent substrate, using the remnants of the first and second films as masks, and then removing the first and second film remnants.

When, on the other hand, the phase shift region is formed by the provision of an additional light-transmitting layer on substantially the same plane as that of the light-shielding layer and situated only in the light-transmitting opening, the optically transparent material layer may consist of the optically transparent substrate, the second film may consist of an optically transparent material, and the step of forming the phase shift region by using the remnants of the second film may comprise the steps of forming a second resist layer on the remnants of the first and second films, etching the first and second films and the second resist layer to the position of a surface of the light-shielding layer, and removing the second resist layer so as to leave the remaining second film as the additional light-transmitting layer.

According to the second aspect of the present invention, there is provided a method of manufacturing an exposure mask for lithography, which mask includes an optically transparent substrate and a light-shielding layer on the optically transparent substrate, the light-shielding layer being patterned to form a single or a plurality of predetermined light-transmitting openings, each of the light-transmitting openings being constituted by a main light-transmitting region located in the middle thereof, and a phase shift region adjacent to the light-shielding layer, the phase of light which is transmitted through the phase shift region being shifted from that of light which is transmitted through the main light-transmitting region, the method comprising the steps of: forming a light-shielding layer on an optically transparent material layer; forming a first film on the light-shielding layer; patterning the first film in correspondence with a main light-transmitting region of a light-transmitting opening; and overetching the light-shielding layer to the position of the light-transmitting opening by using the patterned first film as a mask.

When, in the second aspect, a phase shift region is formed by the provision of an additional light-transmitting layer on the light-shielding layer, with a portion of the additional layer protruding into the light-transmitting opening, the optically transparent material layer may consist of the optically transparent substrate, and the first film may consist of an optically transparent resist material and constitutes the additional light-transmitting layer.

Alternatively, the optically transparent material layer may consist of the optically transparent substrate, the first film may consist of an optically transparent material, and the step of patterning the first film may comprise the steps of forming a resist layer on the first film, patterning the resist layer, and etching the first film using the patterned resist layer as a mask.

As a further alternative, the optically transparent material layer may consist of the optically transparent substrate, the first film may consist of an optically transparent resist material and constitute the additional light-transmitting layer, the light-shielding layer may be patterned prior to formation of the first film, and exposure in order for the first film to be patterned may be performed from the rear surface side of the optically transparent substrate.

On the other hand, when, in the second aspect, the phase shift region is instead formed by the provision of an additional light-transmitting layer between the substrate and the light-shielding layer, with a portion of the additional layer protruding into the light-transmitting opening, the optically transparent material layer consists of the additional light-transmitting layer arranged on the optically transparent substrate and having a predetermined thickness, the first film may consist of a resist material, and the method may further comprise the step of etching the optically transparent material layer, using the patterned first film as a mask.

According to another aspect of the exposure mask of the present invention, the substrate is formed in the shape of a convex lens, in the light-transmitting opening.

According to another aspect of the present invention, there is provided a method of manufacturing the lens type mask, comprising the steps of: forming a light-shielding layer on a substrate; forming a first film on the light-shielding layer; forming a resist layer on the first film; patterning the resist layer in correspondence with a light-transmitting opening; etching the light-shielding layer and the substrate using the patterned resist layer as a mask; removing the resist layer and covering the substrate, the light-shielding layer, and the first film with a second film; isotropically etching the second film so as to leave the second film on only side walls of the light-shielding layer and the first film and a portion of the substrate located on the middle of the light-transmitting opening; and further etching the substrate by using the remnants of the second film.

An exposure method according to the present invention is characterized in that a sharp photo-intensity distribution of transmitted light at the light-transmitting opening is obtained by the exposure mask having the above-described arrangement.

When the light-transmitting opening includes a main light-transmitting region located on the middle thereof and having a first optical path length, and a phase shift region adjacent to the light-shielding layer and having a second optical path length different from the first optical path length, light which is transmitted through the phase shift region interferes with light which is transmitted through the main light-transmitting region so as to obtain a sharp photo-intensity distribution of total transmitted light.

When the substrate is formed in the shape of a convex lens in the light-transmitting opening, refraction of light caused by the lens-like portion makes the photo-intensity distribution of total transmitted light sharp.

BRIEF DESCRIPTION OF THE DRAWINGS

FIGS. 4A to 4E are sectional views showing a method of manufacturing an exposure mask according to the first embodiment of the present invention in the order of steps;

FIGS. 6A to 6E are sectional views showing a method of manufacturing an exposure mask according to the second embodiment of the present invention in the order of steps;

FIGS. 7A to 7F are sectional views showing a structure of a phase shift type exposure mask according to the third embodiment of the present invention and its manufacturing method in the order of steps;

FIGS. 9A to 9D are sectional views showing a structure of a phase shift type exposure mask according to the fifth embodiment of the present invention and its manufacturing method in the order of steps;

FIGS. 11A to 11C are sectional views showing a structure of a phase shift type exposure mask according to the seventh embodiment of the present invention and its manufacturing method in the order of steps;

FIG. 14 is a graph showing a result obtained by measuring best focus positions when the phase shift amount is changed by adjusting the thickness of a light-transmitting layer;

FIGS. 15A and 15B are plan and sectional views showing a DRAM;

FIG. 15C is a sectional view showing a structure of a phase shift type exposure mask according to the eighth embodiment of the present invention;

FIGS. 16A and 16B are partially enlarged views of FIG. 15C;

FIGS. 17A and 17B are views showing a relationship between the section and the photo-intensity distribution of an exposure mask according to the ninth embodiment of the present invention; and FIGS. 18A to 18D are sectional views showing a method of manufacturing the mask according to the ninth embodiment of the present invention in the order of steps.

DETAILED DESCRIPTION OF THE PREFERRED EMBODIMENTS

First Embodiment

Figure 1A:
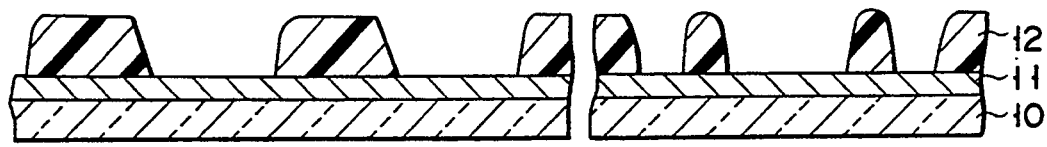
FIGS. 1A to 1C are sectional views showing a method of manufacturing a conventional exposure mask using a phase shift method in the order of steps.
Figure 1B:
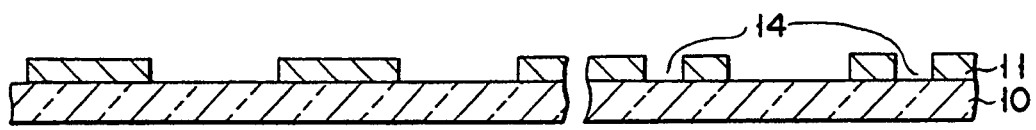
Figure 1C:
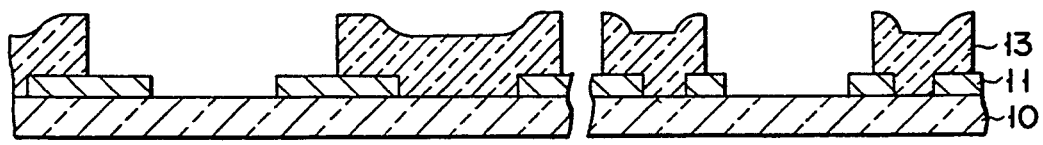
Figure 2A:
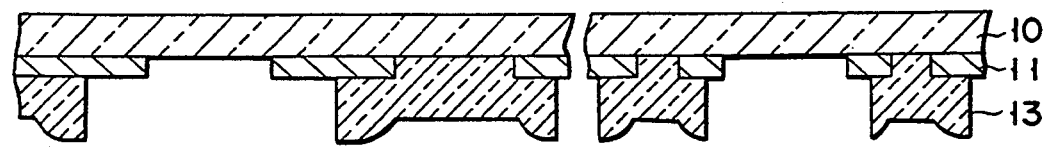
FIGS. 2A and 2B are views showing a relationship between the section and the photo-intensity distribution of the conventional exposure mask.
Figure 2B:
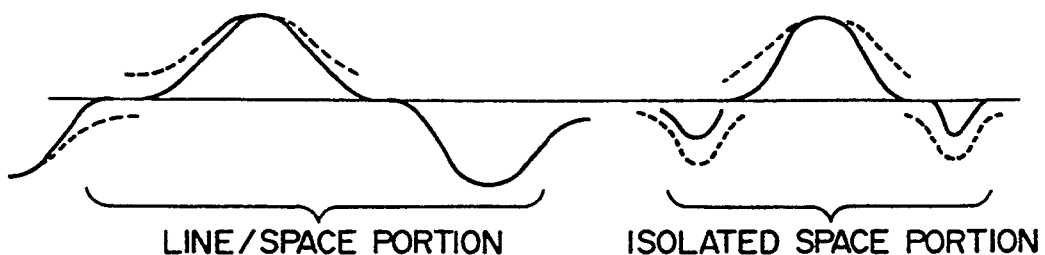
Figure 3A:
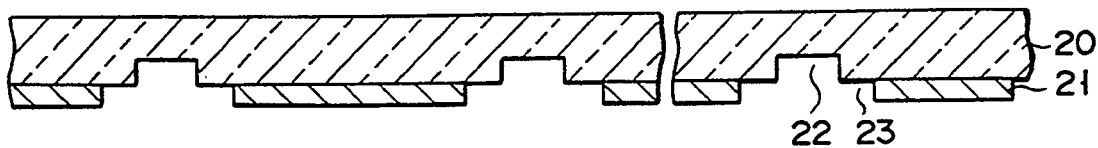
FIGS. 3A to 3C are views showing a relationship between the section, the photo-intensity distribution, and the plan view of a phase shift type exposure mask according to the first embodiment of the present invention.
Figure 3B:
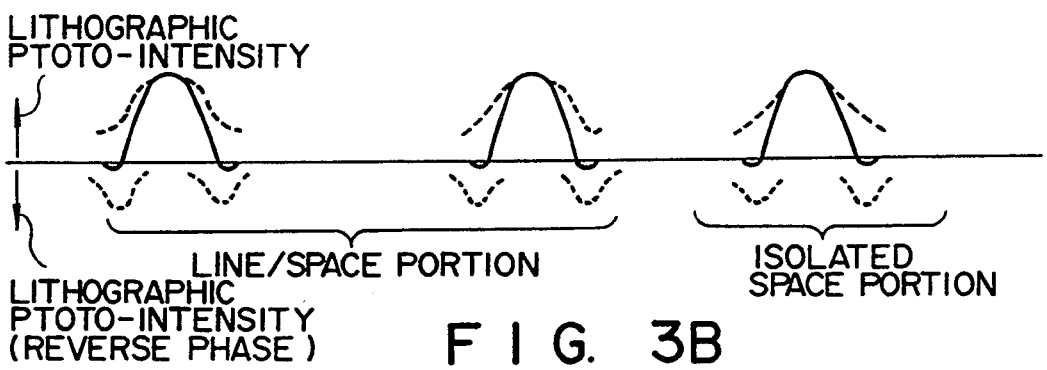
Figure 3C:
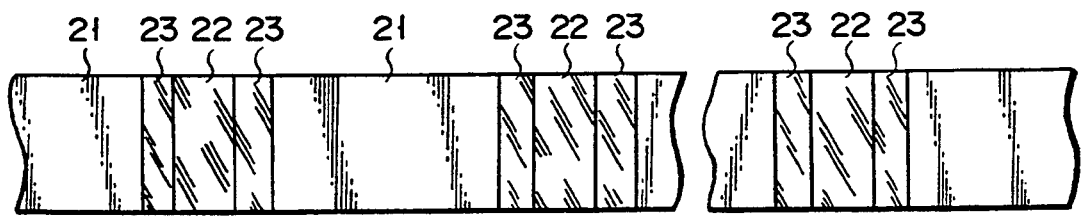

FIGS. 3A to 3C are views showing a relationship between the section and the photo-intensity distribution of a phase shift type exposure mask according to the first embodiment of the present invention.

A pair of light-shielding layers 21 for shielding lithographic light are formed on a mask substrate 20, through which lithographic light is transmitted, so as to obtain a predetermined pattern. In this case, the mask substrate 20 may consist of a quartz material, and the light-shielding layers 21 may consist of chromium, chromium oxide, or stacked layers thereof. A light-transmitting opening is formed in a portion of the mask substrate 20 which is exposed between the pair of light-shielding layers 21. This light-transmitting opening is constituted by a main light-transmitting region 22 formed, in the middle of the opening by etching, into a groove-like shape, and phase shift regions 23 formed to surround the main light-transmitting region 22 and to be adjacent to the light-shielding layers 21.

The optical path length of the main light-transmitting region 22 is different from that of each phase shift region 23. A difference 1d between them is represented by the following equation when the phase of transmitted light is shifted by 180°:

$$1d = nt - nat = \lambda/2$$

where $\lambda$ is the wavelength of transmitted light, t is the depth of the groove in the substrate 20, n is the refractive index of the substrate 20, and na is the refractive index of the atmosphere around the mask. If the atmosphere is air, na is about 1. Therefore, the depth of the groove can be approximated as $t = \lambda/\{2(n-1)\}$. If, for example, the mask substrate 20 consists of quartz, and an i-line ray is used as a light source, the depth of a groove is about 400 nm.

When a wafer is exposed by using the exposure mask formed in the above-described manner, as indicated by dotted lines in FIG. 3B, the phase of the photo-intensity distribution of lithographic light which is transmitted through each phase shift region 23 is shifted, by 180°, from that of lithographic light which is transmitted through the main light-transmitting region 22. Therefore, a photo-intensity distribution obtained by superposing these distributions on each other exhibits a great decrease in intensity at the portions immediately under the phase shift regions 23, and hence sharp distribution curves can be obtained, as indicated by solid curves in FIG. 3B. The resultant dimensional resolution becomes about 0.3 μm which is about ½ the dimensional resolution (about 0.6 μm) of a conventional mask.

FIGS. 4A to 4E are sectional views showing a method of manufacturing a phase shift type exposure mask according to the first embodiment of the present invention in the order of steps.

As shown in FIG. 4A, a light-shielding layer 21 consisting of, for example, chromium or chromium oxide is deposited on the entire surface of a mask substrate 20 consisting of, for example, quartz to a thickness of about 100 nm by sputtering. Subsequently, an SiO₂ film or polysilicon film 24 is deposited on the entire surface of the resultant structure to a thickness of about 100 nm by CVD. In this case, if an SiO₂ film is to be deposited, deposition is performed in, for example, an atmosphere of an SiH₄—CO₂(NO)—H₂ gas mixture at 900° C. If a polysilicon film is to be deposited, deposition is performed in, for example, an atmosphere of an SiH₄—H₂ gas mixture at 650° C. A resist 25 is then coated on the resultant structure, and is patterned into a predetermined design by EB drawing or the like.

As shown in FIG. 4B, the SiO₂ film 24 and the light-shielding layer 21 are removed to form light-transmitting openings by reactive ion etching using the pattern formed by the resist 25 as a mask. A polysilicon film 26 is then deposited on the entire surface of the resultant structure to a thickness of about 300 nm.

As shown in FIG. 4C, the polysilicon film 26 is anisotropically etched by reactive ion etching using a CF₄—O₂ gas mixture in such a manner that portions of the polysilicon film 26 are left on only the side walls of the light-shielding layer 21 and the SiO₂ film 24.

As shown in FIG. 4D, the mask substrate 20 is anisotropically etched by reactive ion etching using a CHF₃—O₂ gas mixture by using the polysilicon film 26 left on the side walls as a mask, thus forming a groove as a main light-transmitting region 22. In addition, an NH₄F treatment or a chemical dry etching treatment may be added for a surface treatment. The depth of this groove is $\lambda/\{2(n-1)\}$, provided that the wavelength of the light source is $\lambda$, and the refractive index of the mask substrate 20 is n.

Subsequently, as shown in FIG. 4E, the SiO₂ film 24 and the polysilicon film 26 are removed by chemical dry etching or by using an etchant.

Because the sintering of the SiO₂ films 24 and the polysilicon 26 is not carried out, the etching rate of the films is very fast, resulting in the perfect removal of the films.

Second Embodiment

Figure 5A:
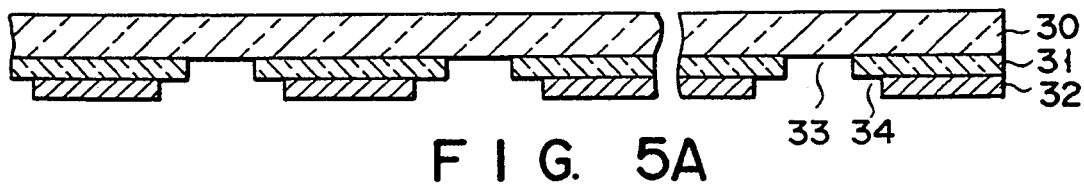
FIGS. 5A and 5B are views showing a relationship between the section and the photo-intensity distribution of a phase shift type exposure mask according to the second embodiment of the present invention.

FIG. 5A is a sectional view of a phase shift type exposure mask according to the second embodiment of the present invention.

Additional light-transmitting and light-shielding layers 31 and 32 are formed on a mask substrate 30. A light-transmitting opening defined by a removed portion of the light-shielding layer 32 is constituted by a main light-transmitting region 33 in which the substrate 30 is exposed at the middle of the opening, and phase shift regions 34 defined by portions of the light-transmitting layer 31 protruding from the light-shielding layer 32.

The optical path length of the main light-transmitting region 33 is different from that of each phase shift region 34. A difference 1d between them is represented by the following equation when the phase of transmitted light is shifted by 180°:

$$1d = nt - nat = \lambda/2$$

where $\lambda$ is the wavelength of transmitted light, t is the thickness of the light-transmitting layer 31, n is the refractive index of the light-transmitting layer 31, and na is the refractive index of the atmosphere around the mask. If the atmosphere is air, na is about 1. Therefore, the thickness can be approximated as $t = \lambda/\{2(n-1)\}$. If, for example, the light-transmitting layer 31 consists of SiO₂, and an i-line ray is used as a light source, the thickness is about 400 nm.

Figure 5B:
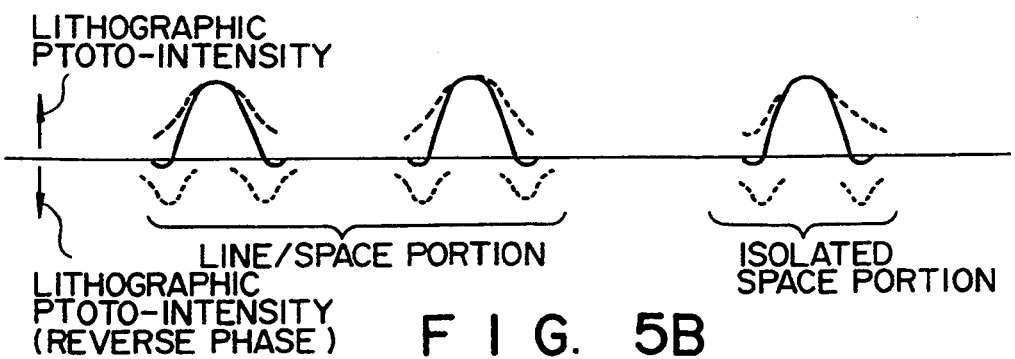

When a wafer is exposed by using the above-described exposure mask, as indicated by dotted lines in FIG. 5B, the phase of the photo-intensity distribution of lithographic light which is transmitted through each phase shift region 34 is shifted, by 180°, from that of lithographic light which is transmitted through the main light-transmitting region 33. Therefore, a photo-intensity distribution obtained by superposing these distributions on each other exhibits a great decrease in intensity at the portions immediately under the phase shift regions 34, and hence sharp distribution curves can be obtained as a whole, as indicated by solid curves in FIG. 5B. The resultant resolution becomes about 0.3 μm which is about ½ in dimension the resolution (about 0.6 μm) of a conventional mask.

FIGS. 6A to 6E are sectional views showing a method of manufacturing a phase shift type exposure mask according to the second embodiment of the present invention in the order of steps.

As shown in FIG. 6A, an additional light-transmitting layer 31 is deposited on a mask substrate 30 consisting of, for example, quartz. In order to shift the phase of transmitted light by 180°, the thickness of the light-transmitting layer 31 is set to be $\lambda/\{2(n-1)\}$, provided that the wavelength of the light source is λ, and the refractive index of the light-transmitting layer 31 is n. If, for example, an i-ray is used as a light source, and the light-transmitting layer 31 consists of an SiO₂ film, the thickness of the film is about 400 nm. Subsequently, a light-shielding layer 32 consisting of chromium or chromium oxide is deposited on the resultant structure to a thickness of about 100 nm. A polysilicon film, a room-temperature liquid-phase-grown SiO₂ film, or a plasma CVD SiO₂ film 35 is deposited on the resultant structure. Thereafter, a resist 36 is coated, and patterning is performed by EB drawing or the like.

As shown in FIG. 6B, the SiO₂ film 35 and the light-shielding layer 32 are removed by reactive ion etching or the like using the pattern formed by the resist 36 as a mask. A polysilicon film 37 is deposited on the entire surface of the resultant structure to a thickness of about 300 nm.

As shown in FIG. 6C, the polysilicon film 37 is anisotropically etched by reactive ion etching using a CF₄—O₂ gas mixture in such a manner that portions of the polysilicon film 37 are left on only the side walls of the light-shielding layer 32 and the SiO₂ film 35.

As shown in FIG. 6D, the light-transmitting layer 31 is anisotropically etched to expose the substrate 30 by reactive ion etching using a CHF₃—O₂ gas mixture by using the polysilicon layer 37 left on the side walls as a mask.

Subsequently, as shown in FIG. 6E, the SiO₂ film 35 and the polysilicon film 37 are removed by dry etching so as to expose the light-transmitting layer 31. With the above-described steps, each opening including a main light-transmitting region 33 constituted by the mask substrate 30 and phase shift regions 34 defined by the portions of the light-transmitting layer 31 which protrude from the light-shielding layer 32 is completed. The present invention is not limited to the SiO₂ film 35 and the polysilicon film 37 described above. Any materials which can be left on the side walls can be used.

Third Embodiment

FIGS. 7A to 7F are sectional views showing a structure of a phase shift type exposure mask according to the third embodiment of the present invention and its manufacturing method.

As shown in FIG. 7F, a light-shielding layer 41 having a predetermined pattern is formed on a mask substrate 40, and a light-transmitting opening is defined by a removed portion of the light-shielding layer 41. Each light-transmitting opening is constituted by a main light-transmitting region 42 in which the substrate 40 is exposed at the middle of the opening, and phase shift regions 43 formed by an additional light-transmitting layer adjacent to the light-shielding layer 41.

The optical path length of the main light-transmitting region 42 is different from that of each phase shift region 43. A difference 1d between them is represented by the following equation when the phase of transmitted light is shifted by 180°:

$$1d = nt - nat = \lambda/2$$

where λ is the wavelength of transmitted light, t is the thickness of the additional light-transmitting layer, n is the refractive index of the additional light-transmitting layer, and na is the refractive index of the atmosphere around the mask. If the atmosphere is air, na is about 1. Therefore, the thickness can be approximated as $t = \lambda/\{2(n-1)\}$. If a wafer is exposed by using the above-described exposure mask, a high resolution can be obtained in the same manner as in the first and second embodiments.

In the method of manufacturing an exposure mask according to the third embodiment of the present invention, as shown in FIG. 7A, a light-shielding layer 41 consisting of, for example, chromium or chromium oxide is deposited on the entire surface of a mask substrate 40 consisting of, for example, quartz, to a thickness of about 100 nm by sputtering. An SiO₂ or polysilicon film 44 is then deposited on the entire surface of the resultant structure to a thickness of about 100 nm by CVD. A resist 45 is coated on the resultant structure and is patterned into a predetermined shape by EB drawing or the like.

Subsequently, as shown in FIG. 7B, the SiO₂ film 44 and the light-shielding layer 41 are removed to form openings by reactive ion etching using the pattern formed by the resist 45 as a mask. An SiO₂ film 46 is deposited on the entire surface of the resultant structure to a thickness of about 100 nm.

As shown in FIG. 7C, the SiO₂ film 46 is anisotropically etched by reactive ion etching using a CF₄—O₂ gas mixture in such a manner that portions of the SiO₂ film 46 are left on only the side walls of the light-shielding layer 41 and the SiO₂ film 44.

As shown in FIG. 7D, a resist 47 is coated on the entire surfaces of the mask substrate 40 and the SiO₂ films 44 and 46 such that the upper surface of the structure becomes flat. As shown in FIG. 7E, the resultant structure is then anisotropically etched by reactive ion etching to the upper surface of the light-shielding layer 41. Thereafter, the resist 47 is removed, as shown in FIG. 7F.

In the first to third embodiments, the i-line ray is used as a light source. However, the present invention is not limited to this but is equally applicable to a case wherein a G-line ray, an excimer laser, or the like is used as a light source. Note, however, that the depth of a groove in a substrate 20 or the thickness of each of additional light-transmitting layers 31 and 43 varies depending on the type of light source, and is determined by $\lambda/\{2(n-1)\}$.

Fourth Embodiment

Figure 8A:
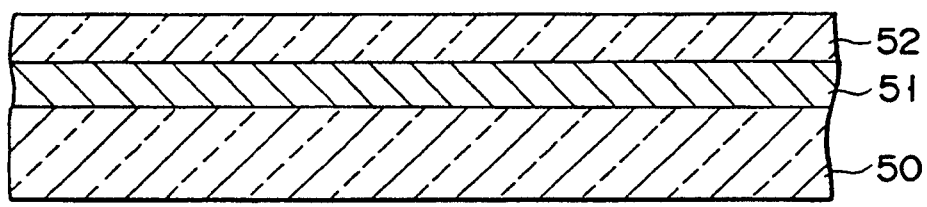
FIGS. 8A to 8C are sectional views showing a structure of a phase shift type exposure mask according to the fourth embodiment of the present invention and its manufacturing method in the order of steps.
Figure 8B:
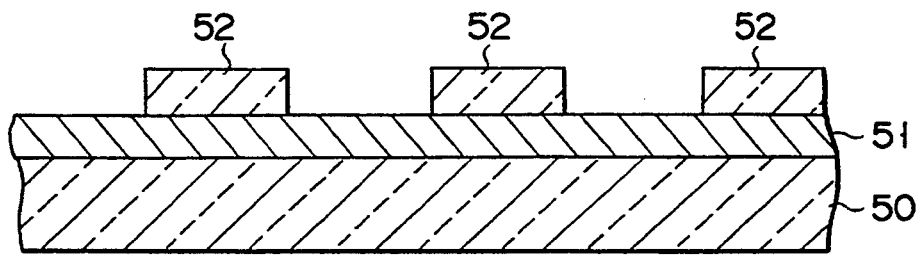
Figure 8C:
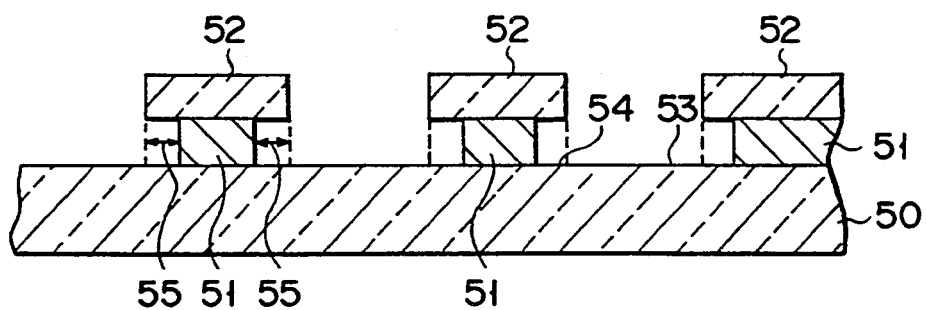

FIGS. 8A to 8C are sectional views showing a structure of a phase shift type exposure mask according to the fourth embodiment of the present invention and its manufacturing method.

As shown in FIG. 8C, this exposure mask comprises a light-shielding layer 51 consisting of a thin chromium film formed on the surface of a light-transmitting quartz substrate 50, and a light-transmitting layer 52 consisting of a polymethylmethacrylate layer pattern stacked on the light-shielding layer 51 so as to protrude from the layer 51 by a predetermined length (for example, about 0.5 μm).

In the above-described exposure mask, each phase shift region is constituted by a protrusion of the light-transmitting layer 52 on the light-shielding layer 51, and a portion of the substrate 50 therebelow. Each main light-transmitting region 53 is constituted by part of an exposed portion of the substrate 50 which is defined between the protrusions of the layer 52. Light which is transmitted through a portion near the edge of the light-shielding layer 51 passes through each protrusion of the light-transmitting layer 52 and is shifted in phase by 180°. The light is then mixed with light which does not pass through the light-transmitting layer 52. As a result, a sharp photo-intensity distribution is obtained.

The optical path length of the main light-transmitting region 52 is different from that of each phase shift region 53. A difference 1d between them is represented by the following equation when the phase of transmitted light is shifted by 180°:

$$1d = nt - nat = \lambda/2$$

where $\lambda$ is the wavelength of transmitted light, t is the thickness of the light-transmitting layer 52, n is the refractive index of the light-transmitting layer 52, and na is the refractive index of the atmosphere around the mask. If the atmosphere is air, na is about 1. Therefore, the thickness t can be approximated as $t = \lambda/\{2(n-1)\}$.

In the method of manufacturing an exposure mask according to the fifth embodiment of the present invention, as shown in FIG. 8A, a light-shielding layer 51 consisting of a 100-nm thick chromium film is formed on a surface of a light-transmitting quartz substrate 50 by sputtering. Thereafter, a polymethylmethacrylate resin (resist) having a molecular weight of 1 million as a light-transmitting layer B2 is coated on the resultant structure by using a spinner and is baked at 180° C. so as to have a thickness of 250 nm. The thickness of this layer is determined on the assumption that the refractive index of the polymethylmethacrylate resin is 1.5 and a KrF excimer laser having a wavelength of 248 nm is used to expose this exposure mask.

Subsequently, as shown in FIG. 8B, drawing is performed by using an EB exposure unit at a dose of 100 $\mu c/cm^2$, and a developing treatment is performed for one minute by using methyl isobutyl ketone, thereby forming a pattern on the light-transmitting layer 52 consisting of the resist.

As shown in FIG. 8C, Just etching is performed for two minutes by using a chromium etchant, and additional etching is then performed for 50 seconds. With this process, a pattern of the light-shielding layer 51 is formed. In addition, undercut portions 55 each having a width of about 0.5 $\mu m$ are defined between the light-shielding and light-transmitting layers 51 and 52. Phase shift regions 54 are constituted by these undercut portions 55.

When the exposure mask formed in this manner was mounted on a KrF excimer laser stepper having a projection lens having a numeral aperture (NA)=0.42, and a 0.5-$\mu m$ thick novolak positive resist PR-1024 coated on a substrate to be processed was exposed, a pattern having a resolution of 0.2 $\mu m$ was obtained with very high precision and excellent reproducibility.

In contrast to this, when exposure was performed by performing exposure by using a conventional exposure mask which was formed in the same manner as described in the embodiment except for the formation of phase shift regions, the resultant pattern had a resolution of only about 0.4 $\mu m$. As is apparent from this comparison, according to the exposure mask and the exposure method using the same of the embodiment of the present invention, a pattern with a very high precision can be obtained.

In addition, according to this method, since the light-shielding layer 51 is formed in self-alignment with the light-transmitting layer 52, no mask alignment is required. Hence, the manufacturing steps are greatly simplified. Moreover, since a resist is directly used as the light-transmitting layer 52, no resist removing step is required.

Fifth Embodiment

FIGS. 9A to 9D are sectional views showing a structure of a phase shift type exposure mask according to the fifth embodiment of the present invention and its manufacturing method in the order of steps.

As shown in FIG. 9D, the finished structure of this exposure mask is the same as that of the mask in the fourth embodiment shown in FIG. 8C and hence has the same function as described above.

In the manufacturing method of this embodiment, as shown in FIG. 9A, a light-shielding layer 61 consisting of a 100-nm thick chromium film is formed on a surface of a light-transmitting quartz substrate 60 by sputtering, and a 250-nm thick silicon oxide film as a light-transmitting layer 62 is subsequently deposited on the resultant structure. In addition, a 250-nm thick polymethylmethacrylate film as a layer of a resist 65 is coated on the resultant structure and is baked at 80° C.

As shown in FIG. 9B, after drawing is performed at a dose of 1,000 $\mu C/cm^2$ by using an EB beam exposure unit, a developing treatment is performed for one minute by using methyl isobutyl ketone, thereby patterning the resist 65. Subsequently, the silicon oxide film as the light-transmitting layer 62 is patterned by reactive ion etching using a $CF_4$—$O_2$ gas mixture.

As shown in FIG. 9C, Just etching is performed for two minutes by using a chromium etchant, and additional etching is performed for 50 seconds, in the same manner as in the fourth embodiment. As a result, undercut portions 66 each having a width of about 0.5 $\mu m$ are defined under the silicon oxide layer pattern as the light-transmitting layer 62. Finally, as shown in FIG. 9D, when the resist 65 is removed, light-transmitting openings having main light-transmitting regions 63 and phase shift regions 64 are obtained.

When pattern exposure was performed by using the exposure mask formed in this manner in the same manner as in the fourth embodiment, a pattern having a very high precision was obtained as in the fourth embodiment.

Sixth Embodiment

FIGS. 10A to 10D are sectional views showing a structure of a phase shift type exposure mask according to the sixth embodiment of the present invention and its manufacturing method in the order of steps.

Figure 10A:
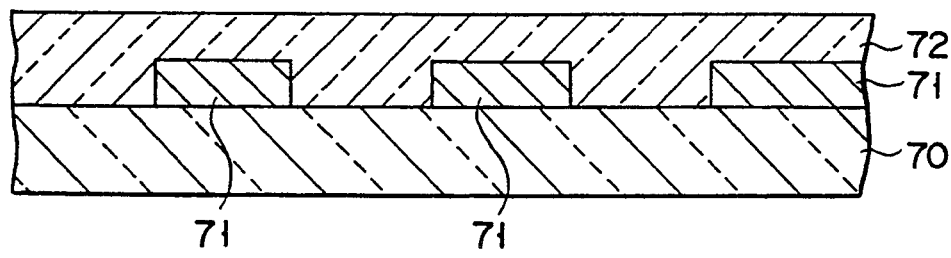
FIGS. 10A to 10D are sectional views showing a structure of a phase shift type exposure mask according to the sixth embodiment of the present invention and its manufacturing method in the order of steps.
Figure 10B:
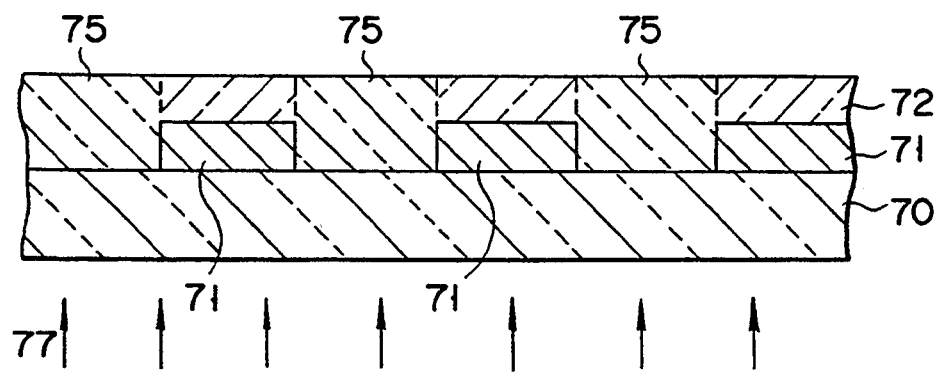
Figure 10C:
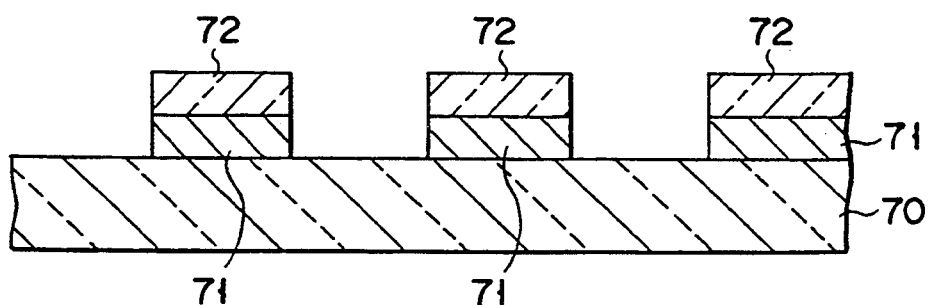
Figure 10D:
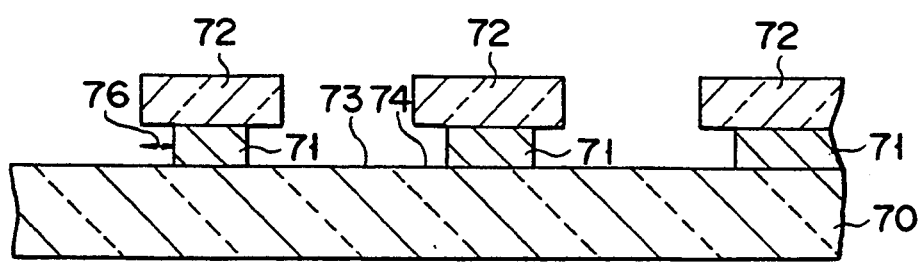

As shown in FIG. 10D, the finished structure of this exposure mask is the same as that of the mask in the fourth embodiment shown in FIG. 8C and hence has the same function as described above.

The manufacturing method of the embodiment is one of the methods capable of forming phase shift light-transmitting layers by processing an exposure mask formed by a conventional method.

As shown in FIG. 10A, by using a conventional method, after a light-shielding layer 71 consisting of a 100-nm thick chromium film is formed on a surface of a light-transmitting quartz substrate 70, polymethylmethacrylate (resist) as a light-transmitting layer 72 is coated on the light-shielding layer 71 so as to have a thickness of 250 nm, and baking is performed at 180° C.

As shown in FIG. 10B, the entire surface of the resultant structure is then exposed by radiating light 77, generated by an Xe-Hg lamp having a wavelength of 240 to 300 nm, from the rear side (indicated by arrows) of the quartz substrate 70 for five minutes, thereby forming a latent image 75.

Subsequently, as shown in FIG. 10C, similar to the fourth embodiment, the light-transmitting layer (resist) 72 is developed. Finally, as shown in FIG. 10D, additional etching is performed to form undercut portions 76 under the pattern of the resist 72. With this process, light-transmitting openings having main light-transmitting regions 73 and phase shift regions 74 are obtained.

When pattern exposure was performed in the same manner as in the fourth and fifth embodiments by using the exposure mask formed in this manner, a pattern having a very high precision was obtained as in the fourth and fifth embodiments.

Seventh Embodiment

FIGS. 11A to 11C are sectional views showing a structure of a phase shift type exposure mask according to the seventh embodiment of the present invention and its manufacturing method in the order of steps.

As shown in FIG. 11C, this exposure mask comprises a light-transmitting layer 81 formed on a surface of a light-transmitting quartz substrate 80, and a 100-nm thick light-shielding layer 82 consisting of stacked films of thin chromium and chromium oxide films formed on the layer 81. This light-transmitting layer 81 consists of a 400-nm thick silicon oxide layer which is formed between the light-shielding layer 82 and the quartz substrate 80 so as to protrude from the layer 82 by a predetermined length. That is, a phase shift region 84 is constituted by a protruding portion of the light-transmitting layer 81, and a main light-transmitting region 83 is constituted by an exposed portion of the mask substrate 80. With this arrangement, exposure light which is transmitted through a portion near the edge of the light-shielding layer 82 passes through the light-transmitting layer 81 and hence is inverted in phase by 180°. The light is then mixed with light which does not pass through the light-transmitting layer 81. As a result, a sharp photo-intensity distribution is obtained.

In the method of manufacturing an exposure mask of the seventh embodiment, as shown in FIG. 11A, a 400-nm thick silicon oxide film as a light-transmitting layer 81 is deposited on a surface of a light-transmitting quartz substrate 80 by CVD. A 100-nm thick light-shielding layer 82 consisting of stacked films of chromium and chromium oxide films is then formed on the resultant structure by sputtering. Thereafter, a resist 85 is coated and patterned. In this case, a 250-nm thick polymethylmethacrylate film also may be used as the light-transmitting layer 81. The thickness of the layer 81 is determined on the assumption that the polymethylmethacrylate film has a refractive index of 1.5 and a KrF excimer laser having a wavelength of 248 nm is used to expose this exposure mask.

As shown in FIG. 11B, the light-shielding layer 82 is etched by isotropic etching using the pattern of the resist 85 as a mask so as to form undercut portions. In this case, isotropic etching is used to produce a transformation difference $\Delta$ between the light-shielding and light-transmitting layers.

Subsequently, as shown in FIG. 11C, the silicon oxide film as the light-transmitting layer 81 is etched by anisotropic etching using the pattern of the resist 85 as a mask. As a result, light-transmitting openings having main light-transmitting regions 83 and phase shift regions 84 are obtained.

When pattern exposure was performed in the same manner as described in the fourth to sixth embodiments by using the exposure mask formed in this manner, a pattern having a very high precision was obtained as in the fourth to sixth embodiments.

In the process of the seventh embodiment, after the resist pattern is formed, the undercut portions of the light-shielding layer 82 are formed by isotropic etching, and the light-transmitting layer 81 is patterned by anisotropic etching. However, the light-shielding and light-transmitting layers may be etched by anisotropic etching first, and the light-shielding layer may be subsequently etched by isotropic etching so as to form the transformation difference $\Delta$.

The present invention has been described with reference to its embodiments. In the above description, the thickness of each light-transmitting layer is set in such a manner that the phase of light passing through the light-transmitting layer is shifted, by 180°, from that of light which is transmitted through the mask substrate. However, if the shift amount is to be set at an arbitrary angle, the thickness of each shifter may be adjusted.

Figure 12A:
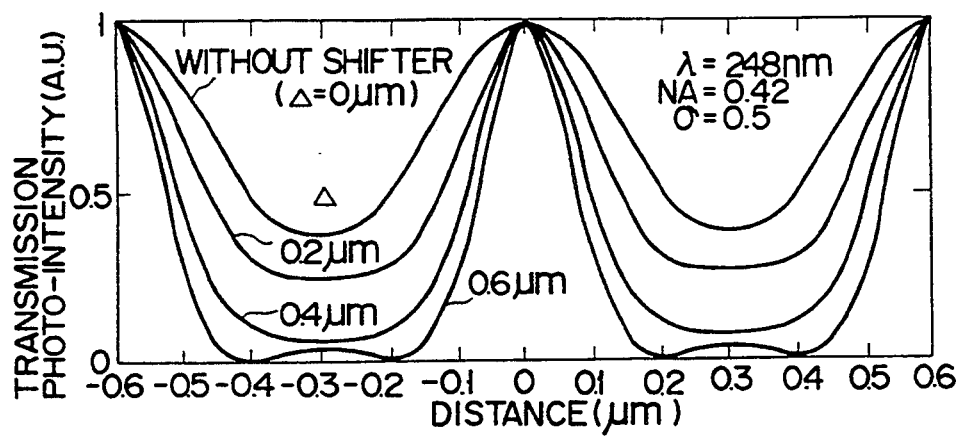
FIGS. 12A and 12B and FIGS. 13A and 13B are views respectively showing relationships between a protrusion amount Δ of a light-transmitting layer from a light-shielding layer as a factor of a phase shift region and the photo-intensity.
Figure 12B:
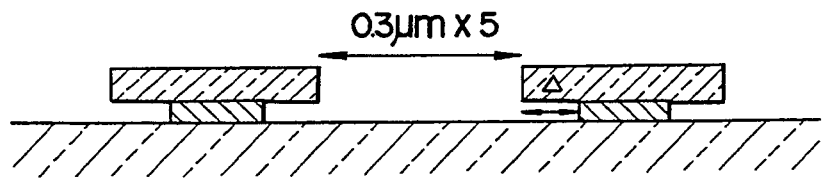
Figure 13A:
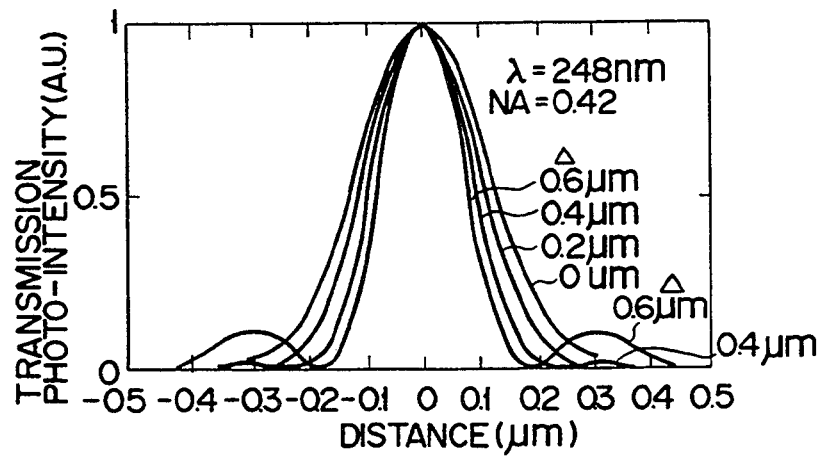
Figure 13B:
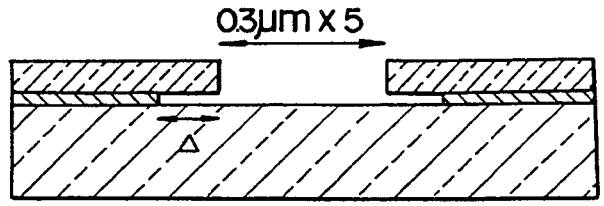

FIGS. 12A and 12B and FIGS. 13A and 13B respectively show relationships between protrusion amounts $\Delta$ of light-transmitting layers with respect to light-shielding layers, as factors of phase shift regions, and photo-intensities. The mask structure is based on the structure of the fourth to sixth embodiments. FIGS. 12A and 12B show the relationship associated with a line/space portion of the exposure mask. Both the line and space widths on the mask were set to be 1.5 $\mu$m, and a line/space image having a resolution of 0.3 $\mu$m was obtained by 1/5 reduction projection exposure. FIGS. 13A and 13B show the relationship associated with an isolated space portion of the exposure mask. The space width was 1.5 $\mu$m, and a space image having a resolution of 0.3 $\mu$m was obtained by 1/5 reduction projection exposure. In this case, a light source wavelength $\lambda = 248$ nm, a projection lens numerical aperture $NA = 0.42$, and a coherent coefficient $\sigma = 0.5$.

As is apparent from FIGS. 12A and 12B and FIGS. 13A and 13B, $\Delta =$ about 0.5 $\mu$m is proper for a space width $= 1.5$ $\mu$m.

Best focus positions were measured while the shift amount was changed by adjusting the thickness of a light-transmitting layer. FIG. 14 shows the measurement result. In this case, best focus positions were measured with respect to light-transmitting layers which were designed such that the phase of light passing through the layers is shifted from that of light which is transmitted through the corresponding mask substrates by 180°, slightly larger than 180°, and slightly smaller than 180°, respectively. It is found from this result that the best focus position is changed by shifting the phases from each other by slightly larger or smaller than 180°.

FIG. 14 shows a relationship between the resist size and the best focus position when a design size of 0.5 $\mu$m, an i-ray stepper, and a lens having a numerical aperture of 0.4 are used. In this case, if the phase difference between light which is transmitted through a mask substrate and light which is transmitted through a light-transmitting layer is 150°, the best focus position is shifted by 1 $\mu$m from that of the case wherein the phase difference is 180°.

By utilizing this phenomenon, the precision of an exposure mask applied to a substrate having a large difference in level can be improved.

Eighth Embodiment

In a DRAM, for example, a cell array and a peripheral circuit are generally integrated on a single substrate. FIGS. 15A and 15B show a case wherein a cell array portion is higher than a peripheral circuit. In such a case, when a wiring pattern is to be transferred onto the cell array and the peripheral circuit of DRAM at once by using a single mask substrate so as to form a wiring layer on their surfaces, since their best focus positions differ from each other, a high-precision pattern cannot be formed. In a conventional method, therefore, the resist surface is made flat by using the multilayer resist method (SREP) or the like, and the resultant structure is subsequently exposed, thus complicating the process.

According to the eighth embodiment of the present invention, as shown in FIG. 15C, a light-transmitting layer 91a having a thickness for causing a 180° phase shift with respect to the mask substrate is arranged at the cell array portion located at the center of the substrate, and a light-transmitting layer 91b having a thickness for causing a 150° phase shift with respect to the mask substrate is arranged at the peripheral circuit located at the peripheral portion of the substrate. Light-transmitting layers 91a and 91b are interposed between substrate 90 and light-shielding layer 92. With this arrangement, the best focus positions of the cell array and the peripheral circuit are shifted from each other.

FIGS. 16A and 16B are enlarged sectional views respectively showing the cell array and the peripheral circuit of DRAM. As shown in FIGS. 16A and 16B, the mask substrate has a structure in which light-transmitting layers 91a and 91b respectively consisting of silicon oxide film patterns having different thicknesses are interposed between a substrate 90 and a light-shielding layer 92, the thicknesses of the film patterns being different for the cell array and the peripheral circuit.

By only additionally performing a simple treatment for an exposure mask in this manner, photolithography for a surface having a difference in level can be very easily performed with high precision.

Note that this method can be applied to all the steps involving photolithography for a surface having a difference in level in the manufacturing process of not only a DRAM but also other devices.

In this case, a light-transmitting layer may be formed on a light-shielding layer or may be formed on the same plane.

Ninth Embodiment

FIG. 17A is a sectional view of an exposure mask according to the ninth embodiment of the present invention.

A pair of light-shielding layers 101 for blocking lithographic light are formed on a mask substrate 100, through which lithographic light is transmitted, so as to obtain a predetermined pattern. A portion of the mask substrate 100 which is exposed between the light-shielding layers 101 is formed in the shape of a convex lens for focusing light on a wafer through the mask substrate.

When the wafer is exposed by using the above mask, lithographic light radiated from above the mask is focused at the convex lens region as an opening of the mask substrate 100, as indicated by arrows in FIG. 17A. As a result, the photo-intensities of portions adjacent to the light-shielding layer 101 are greatly decreased. Therefore, in comparison with photo-intensity distributions obtained by a conventional mask substrate without a convex lens shape as indicated by dotted curves in FIG. 17B, sharp photo-intensity distributions can be realized, as indicated by solid curves. Hence, a pattern can be formed with a higher resolution than the conventional method.

FIGS. 18A to 18D are sectional views showing a method of manufacturing a mask according to the ninth embodiment of the present invention in the order of steps.

As shown in FIG. 18A, a light-shielding layer 101 consisting of, for example, chromium or chromium oxide is deposited on the entire surface of a mask substrate 100 consisting of, for example, quartz to a thickness of about 100 nm. After a resist 102 is coated on the entire surface of the light-shielding layer 101, patterning is performed by EB drawing or the like. As shown in FIG. 18B, the light-shielding layer 101 is removed by reactive ion etching using the pattern formed by the resist 102 as a mask. The mask substrate 100 is then anisotropically etched by reactive ion etching using a $CHF_3$—$O_2$ gas mixture so as to form a groove 103 having a depth of about 100 nm. An $SiO_2$ film 104 is deposited on the entire surface of the resultant structure by plasma CVD.

As shown in FIG. 18C, when isotropic etching is performed by using an $NH_4F$ etchant or the like, etching proceeds first from a brittle portion 105 (see FIG. 18B) of the plasma CVD oxide film on the side walls of the groove 103, and hence step portions of the groove 103 are mainly etched. As a result, the $SiO_2$ film 104 is left on the central portion and the upper portions of the side walls of the groove 103.

As shown in FIG. 18D, by successively performing etching, the mask substrate 100 is etched into arcuate shapes and the $SiO_2$ film 104 left on the central portion and the upper portions of the side walls of the groove 103 is also etched. As a result, portions of the mask substrate 100 in the mask opening portions are formed in the shape of a convex lens, thus completing the mask.

The preferred embodiments of the present invention have been described in detail above with reference to the accompanying drawings. However, various changes and modifications can be made within the spirit and scope of the invention.

For example, a polymethylmethacrylate film used also as a resist and a silicon oxide layer as an inorganic film are used for a light-transmitting layer. However, the present invention is not limited to this. Any materials having high transmittance with respect to light having a wavelength of 436 nm or less as exposure light may be used. For example, an inorganic film may consist of calcium fluoride (CaF), magnesium fluoride (MgF), aluminum oxide ($Al_2O_3$), or the like. A resist may be composed of polymethylmethacrylate, polytrifluoroethyl-α-chloroacrylate, chloromethylated polystyrene, polydimethylglutarimide, polymethylisopropenylketone, or the like. The thickness and the like of a pattern can be changed in accordance with a material and lithographic light. The materials of optically transparent substrates and light-shielding layers are not limited to those in the embodiments but may be properly changed. In addition, a light-transmitting layer need not perform 180° phase shift. The phase shift may deviate from 180° as long as the photo-intensity distribution of the edge of a light-shielding layer sharply decreases. For example, if a pattern error of about ±1 μm is allowed, the phase shift amount may be changed between 150° and 210°.

In the embodiments wherein the phase shift regions are formed by arranging the additional light-transmitting layers on the light-transmitting openings, portions of the optically transparent substrate, as main light-transmitting regions, need not be exposed, but the material used for the phase shift regions may be left on the surfaces of the portions of the optically transparent substrate. In this case, however, the thickness of the material of the phase shift regions must be changed accordingly. The manufacturing method can be realized by stopping etching before etching progresses to the surface of an optically transparent substrate.

What is claimed is:

1. An exposure mask for lithography having a pattern of light-transmitting openings, comprising:
   an optically transparent substrate;
   a light-transmitting layer formed on said optically transparent substrate, said light-transmitting layer being patterned such that exposed portions of said optically transparent substrate are formed at positions substantially corresponding to the center of each of said light-transmitting openings and such that extension portions of said light-transmitting layer surround said exposed portions; and
   a light-shielding layer formed on said light-transmitting layer, said light-shielding layer being patterned to define said light-transmitting openings so that said extension portions of said light-transmitting layer are adjacent to said light-shielding layer, wherein each of said light-transmitting openings has a main light-transmitting region located at positions corresponding to said exposed portions of said optically transparent substrate and a phase shift region located at positions corresponding to said extension portions of said light-transmitting layer, said main light-transmitting region having a first optical path length and said phase shift region having a second optical path length which is different from said first optical path length.

2. An exposure mask according to claim 1, wherein a phase of light which is transmitted through said phase shift region is shifted by 180° from that of light which is transmitted through said main light-transmitting region.

3. An exposure mask according to claim 1, wherein said optically transparent substrate is comprised of a material selected from the group consisting of quartz, calcium fluoride, magnesium fluoride, and aluminum oxide, and said light-transmitting layer is comprised of a material selected from the group consisting of $SiO_2$, polymethylmethacrylate, calcium fluoride, magnesium fluoride, and aluminum oxide.

4. An exposure mask according to claim 1, wherein said light-transmitting openings include first and second light-transmitting openings for exposing first and second portions of an object, said second portion of said object being located a further distance from said exposure mask than said first portion of said object, and wherein a phase shift amount at said first light-transmitting opening is larger than that at said second light-transmitting opening.

5. An exposure mask for lithography having a pattern, of light-transmitting openings, comprising:
   an optically transparent substrate;
   a light-shielding layer formed on said optically transparent substrate, said light-shielding layer being patterned to define said light-transmitting openings; and
   a light-transmitting layer formed on said optically transparent substrate and having a thickness substantially identical to that of said light-shielding layer so that upper surfaces of said light-transmitting layer and said light-shielding layer are substantially flush with one another, said light-transmitting layer being arranged only within each of said light-transmitting openings and at positions adjacent to said light-shielding layer so as to surround exposed portions of said optically transparent substrate which are located at positions substantially corresponding to the center of each of said light-transmitting openings, wherein each of said light-transmitting openings has a main light-transmitting region located at positions corresponding to said exposed portions of said optically transparent substrate and a phase shift region located at a position corresponding to said light-transmitting layer, said main light-transmitting region having a first optical path length and said phase shift region having a second optical path length which is different from said first optical path length.

6. An exposure mask according to claim 5, wherein a phase of light which is transmitted through said phase shift region is shifted by 180° from that of light which is transmitted through said main light-transmitting region.

7. An exposure mask according to claim 5, wherein said optically transparent substrate is comprised of a material selected from a group consisting of quartz, calcium fluoride, magnesium fluoride, and aluminum oxide, and said light-transmitting layer is comprised of a material selected from the group consisting of $SiO_2$, polymethylmethacrylate, calcium fluoride, magnesium fluoride, and aluminum oxide.

8. An exposure mask according to claim 5, wherein said light-transmitting openings include first and second light-transmitting openings for exposing first and second portions of an object, said second portion of said object being located a further distance from said exposure mask than said first portion of said object, and wherein a phase shift amount at said first light-transmitting opening is larger than that at said second light-transmitting opening.

9. An exposure mask for lithography having a pattern of light-transmitting openings, comprising:
   an optically transparent substrate;
   a light-shielding layer formed on said optically transparent substrate, said light-shielding layer being patterned to define said light-transmitting openings; and
   a light-transmitting layer formed on said light-shielding layer, said light-transmitting layer being patterned such that exposed portions of said optically transparent substrate are formed at positions substantially corresponding to the center of each of said light-transmitting openings and such that extension portions of said light-transmitting layer surround said exposed portions, said extension portions being located adjacent to said light-shielding layer such that spaces having a thickness substantially identical to that of said light-shielding layer are formed between said optically transparent substrate and said extension portions, wherein each of said light-transmitting openings has a main light-transmitting region located at positions corresponding to said exposed portions of said optically transparent substrate and a phase shift region located at positions corresponding to said extension portions of said light-transmitting layer, said main light-transmitting region having a first optical path length and said phase shift region having a second optical path length which is different from said first optical path length.

10. An exposure mask according to claim 9, wherein a phase of light which is transmitted through said phase shift region is shifted by 180° from that of light which is transmitted through said main light-transmitting region.

11. An exposure mask according to claim 9, wherein said optically transparent substrate is comprised of a material selected from the group consisting of quartz, calcium fluoride, magnesium fluoride, and aluminum oxide, and said light-transmitting layer is comprised of a material selected from the group consisting of $SiO_2$, polymethylmethacrylate, calcium fluoride, magnesium fluoride, and aluminum oxide.

12. An exposure mask according to claim 9, wherein said light-transmitting openings include first and second light-transmitting openings for exposing first and second portions of an object, said second portion of said object being located a further distance from said exposure mask than said first portion of said object, and wherein a phase shift amount at said first light-transmitting opening is larger than that at said second light-transmitting opening.

13. An exposure mask for lithography having first and second light-transmitting openings for exposing first and second portions of an object, said second portion of said object being located a further distance from said exposure mask than said first portion of said object, said exposure mask comprising:

an optically transparent substrate;

a first light-transmitting layer formed on said optically transparent substrate, said first light-transmitting layer being patterned such that a first exposed portion of said optically transparent substrate is formed at a position substantially corresponding to a center of said first light-transmitting opening and such that an extension portion of said first light-transmitting layer surrounds said first exposed portion of said optically transparent substrate;

a first light-shielding layer formed on said first light-transmitting layer, said first light-shielding layer being patterned to define said first light-transmitting opening so that said extension portion of said first light-transmitting layer is adjacent to said first light-shielding layer, wherein said first light-transmitting opening has a main light-transmitting region located in a position corresponding to said first exposed portion of said optically transparent substrate and a phase shift region located at a position corresponding to said extension portion of said first light-transmitting layer, said main light-transmitting region having a first optical path length and said phase shift region having a second optical path length which is different from said first optical path length;

a second light-transmitting layer formed on said optically transparent substrate, said second light-transmitting layer being patterned such that a second exposed portion of said optically transparent substrate is formed at a position substantially corresponding to a center of said second light-transmitting opening and such that an extension portion of said second light-transmitting layer surrounds said second exposed portion of said optically transparent substrate; and a second light-shielding layer formed on said second light-transmitting layer, said second light-shielding layer being patterned to define said second light-transmitting opening so that said extension portion of said second light-transmitting layer is adjacent to said second light-shielding layer, wherein said second light-transmitting opening has a main light-transmitting region located in a position corresponding to said second exposed portion of said optically transparent substrate and a phase shift region located at a position corresponding to said extension portion of said second light-transmitting layer, said main light-transmitting region having said first optical path length and said phase shift region having a third optical path length which is different from said first optical path length, wherein said second and said third optical path lengths are set such that a phase shift amount at said first light-transmitting opening is larger than that at said second light-transmitting opening.

* * * * *

UNITED STATES PATENT AND TRADEMARK OFFICE
CERTIFICATE OF CORRECTION

PATENT NO. : 5,358,808
DATED : October 25, 1994
INVENTOR(S) : Akihiro Nitayama et al.

It is certified that error appears in the above-indentified patent and that said Letters Patent is hereby corrected as shown below:

On the title page, Item [75],

The third inventor's last name is spelled incorrectly, should read: --Hashimoto--

Signed and Sealed this

Twenty-eight Day of February, 1995

Attest:

BRUCE LEHMAN

*Attesting Officer*     *Commissioner of Patents and Trademarks*